United States Patent
Liang et al.

(10) Patent No.: US 12,306,347 B2
(45) Date of Patent: May 20, 2025

(54) TIME-OF-FLIGHT SENSOR, DISTANCE MEASURING SYSTEM, AND ELECTRONIC DEVICE

(71) Applicant: SHENZHEN GOODIX TECHNOLOGY CO., LTD., Guangdong (CN)

(72) Inventors: Yu-An Liang, Guangdong (CN); Meng-Ta Yang, Guangdong (CN)

(73) Assignee: SHENZHEN GOODIX TECHNOLOGY CO., LTD., Guangdong (CN)

(*) Notice: Subject to any disclaimer, the term of this patent is extended or adjusted under 35 U.S.C. 154(b) by 920 days.

(21) Appl. No.: 17/473,844

(22) Filed: Sep. 13, 2021

(65) Prior Publication Data

US 2022/0128669 A1    Apr. 28, 2022

Related U.S. Application Data

(63) Continuation of application No. PCT/CN2020/123617, filed on Oct. 26, 2020.

(51) Int. Cl.
*G01S 7/48* (2006.01)
*G01S 7/4863* (2020.01)
(Continued)

(52) U.S. Cl.
CPC .......... *G01S 7/4865* (2013.01); *G01S 7/4863* (2013.01); *H03K 5/135* (2013.01); *G01S 17/894* (2020.01)

(58) Field of Classification Search
USPC ...................................................... 356/5.01
See application file for complete search history.

(56) References Cited

U.S. PATENT DOCUMENTS 10,061,029 B2 * 8/2018 Waligorski ............ G01S 7/4914
10,353,058 B2 * 7/2019 Ta .......................... G01S 7/4865
(Continued)

FOREIGN PATENT DOCUMENTS

CN    105894492 A    8/2016
CN    108445499 A    8/2018
(Continued)

OTHER PUBLICATIONS

English Abstract of JP2003167053A, CN111736173A, CN111398979A, CN111194413A, CN110850424A, CN110574364A, CN110133671A, CN109313264A, CN108445499A, CN105894492A.
(Continued)

*Primary Examiner* — James R Hulka
(74) *Attorney, Agent, or Firm* — WPAT, P.C.; Anthony King (57) ABSTRACT

The present application discloses a time-of-flight (TOF) sensor and a related chip, electronic device, and distance measuring system. The TOF sensor includes: a clock signal generation circuit to generate a first clock signal and a second clock signal; a transmission circuit to generate a third clock signal based on the first clock signal, wherein the third clock signal is outputted to the light-emitting module; a replicated transmission circuit to simulate the transmission circuit, and generate a fourth clock signal based on the second clock signal; a delay locked loop to generate a fifth clock signal based on one of sixth clock signals and the fourth clock signal; a clock tree to generate the plurality of sixth clock signals based on the fifth clock signal; a pixel array, having pixel columns respectively sampling the reflected light pulse based on the plurality of sixth clock signals to generate a sampling result.

20 Claims, 6 Drawing Sheets

(51) Int. Cl.
    *G01S 7/4865*      (2020.01)
    *H03K 5/135*      (2006.01)
    *G01S 17/894*      (2020.01)

(56) References Cited

U.S. PATENT DOCUMENTS

| | | | |
|---|---|---|---|
| 10,382,736 B1* | 8/2019 | Thurner | G01S 17/36 |
| 10,523,849 B2* | 12/2019 | Liang | G01S 7/497 |
| 11,385,336 B2* | 7/2022 | Emadi | G01S 7/4913 |
| 12,181,576 B2* | 12/2024 | Yang | H10F 39/803 |
| 2013/0278917 A1 | 10/2013 | Korekado et al. | |
| 2014/0375851 A1 | 12/2014 | Lee et al. | |
| 2016/0198147 A1* | 7/2016 | Waligorski | G01S 17/36 348/49 |
| 2017/0026590 A1 | 1/2017 | Wang et al. | |
| 2019/0058812 A1* | 2/2019 | Liang | G01S 7/497 |
| 2019/0107608 A1* | 4/2019 | Ta | G01S 7/4865 |
| 2019/0253688 A1* | 8/2019 | Thurner | G01S 17/46 |
| 2020/0041628 A1* | 2/2020 | Emadi | G01S 7/4913 |
| 2021/0018623 A1* | 1/2021 | Yang | G01S 17/36 |
| 2022/0277467 A1* | 9/2022 | Yang | G01S 7/4816 |

FOREIGN PATENT DOCUMENTS

| | | |
|---|---|---|
| CN | 109313264 A | 2/2019 |
| CN | 110133671 A | 8/2019 |
| CN | 110574364 A | 12/2019 |
| CN | 110850424 A | 2/2020 |
| CN | 111194413 A | 5/2020 |
| CN | 11139897 A | 7/2020 |
| CN | 111736173 A | 10/2020 |
| JP | 2003167053 A | 6/2003 |
| WO | 2019033382 A1 | 2/2019 |

OTHER PUBLICATIONS

As-filed PCT Request of PCT/CN2020/123617.
As-filed PCT Application of PCT/CN2020/123617.
International Searching Authority (ISA) Form 202—Notification of Receipt of Search Copy of PCT/CN2020/123617.
International Searching Authority (ISA) Form 210—International Search Report of PCT/CN2020/123617.
International Searching Authority (ISA) Form 220—Notification of Transmittal of the International Search Report and the Written Opinion of the International Searching Authority, or the Declaration of PCT/CN2020/123617.
International Searching Authority (ISA) Form 237—Written Opinion of PCT/CN2020/123617.
Notification of the International Application number and of the International Filing Date—Form 105 of PCT/CN2020/123617.

* cited by examiner

TIME-OF-FLIGHT SENSOR, DISTANCE MEASURING SYSTEM, AND ELECTRONIC DEVICE

CROSS-REFERENCE TO RELATED APPLICATIONS

This application is a continuation of International Application No. PCT/CN2020/123617, filed on Oct. 26, 2020, the disclosure of which is hereby incorporated by reference in its entirety.

TECHNICAL HELD

The present application relates to a sensor; particularly a time-of-flight sensor, a distance measuring system, and an electronic device.

BACKGROUND

CMOS image sensors have been mass produced and widely used. While traditional image sensors can generate two-dimensional (2D) images and videos, recently there has been a lot of interest in image sensors and systems that can generate three-dimensional (3D) images for applications such as face recognition, augmented reality (AR)/virtual reality (VR), and drones, etc.

One of the existing implementations of 3D image sensors is the time-of-flight (TOF) distance measurement technique. In this technique, in order to increase the accuracy, it is necessary to ensure that the phase relationship between the transmission time point of the light pulse and the sampling time point of the reflected light pulse is synchronized or fixed at a predetermined value, otherwise the accuracy will be degraded; therefore, how to achieve the above purpose has become an important task in this field.

SUMMARY OF THE INVENTION

One purpose of the present application is to disclose a time-of-flight (TOF) sensor, a distance measuring system, and an electronic device that can ensure that the phase relationship between the transmission time point of the light pulse and the sampling time point of the reflected light pulse is fixed at a preset value, so as to solve the issues mentioned above.

One embodiment of the present application discloses a TOF sensor; which controls a light-emitting module to intermittently transmit a light pulse, wherein the light pulse is reflected by a target to generate a reflected light pulse; the TOF sensor includes: a clock signal generation circuit, configured to generate a first clock signal and a second clock signal, wherein the first clock signal and the second clock signal have the same frequency, and there is a predetermined phase difference between the first clock signal and the second clock signal; a transmission circuit, configured to generate a third clock signal based on the first clock signal, wherein the third clock signal is outputted to the light-emitting module so that the light-emitting module intermittently transmits the light pulse; a replicated transmission circuit; configured to simulate the transmission circuit, and generate a fourth clock signal based on the second clock signal, so that the phase difference between the fourth clock signal and the third signal is kept the same as a predetermined phase difference when temperature, bias voltage, or process changes; a delay locked loop, coupled to the replicated transmission circuit and one of a plurality of sixth clock signals to generate a fifth clock signal, so that the phase difference between one of the plurality of sixth clock signals and the fourth clock signal is kept at zero; a clock tree; configured to generate the plurality of sixth clock signals based on the fifth clock signal, wherein a plurality of phases of the plurality of sixth clock signals are all the same; and a pixel array, having a plurality of pixel columns, wherein the plurality of pixel columns respectively sampling the reflected light pulse based on the plurality of sixth clock signals to generate a sampling result.

One embodiment of the present application discloses a TOF distance measuring system; the TOF distance measuring system includes: the above-mentioned. TOF sensor; and the light-emitting module, including: a light source control path, configured to generate a light source control signal based on the third clock signal; and a light source, configured to intermittently transmit the light pulse based on the light source control signal.

One embodiment of the present application discloses a TOF distance measuring system; the TOF distance measuring system includes: the above-mentioned. TOF sensor; and the light-emitting module, including: a light source control path, configured to generate a light source control signal based on the third clock signal; a replicated light source control path, coupled between the replicated transmission circuit and the delay locked loop, wherein the replicated light source control path is configured to simulate the light source control path, and generate a seventh clock signal to the delay locked loop of the TOF sensor based on the fourth clock signal, so that the phase difference between the light source control signal and the seventh clock signal is kept the same as a predetermined phase difference when temperature, bias voltage, or process changes; and a light source, configured to intermittently transmit the light pulse based on the light source control signal.

One embodiment of the present application discloses an electronic device, including the above-mentioned distance measuring system and a processor, coupled to the distance measuring system.

The TOF sensor, the distance measuring system and the electronic device of the present disclosure can ensure that the phase relationship between the transmission time point of the light pulse and the sampling time point of the reflected light pulse is fixed at a preset value, so as to maintain the accuracy of the thus-obtained depth information.

DETAILED DESCRIPTION

The following disclosure provides many different embodiments or examples for implementing different features of the present disclosure. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact and may also include embodiments in which additional features may be formed between the first and second features, such that the first and second features may not be in direct contact. In addition, the present disclosure may repeat reference numerals and/or letters in the various embodiments. This repetition is for the purpose of simplicity and clarity and does not in itself dictate a relationship between the various embodiments and/or configurations discussed.

Further, spatially relative terms, such as "beneath," "below," "lower," "above," "upper," and the like, may be used herein for ease of description to discuss one element or feature's relationship to another element(s) or feature(s) as illustrated in the drawings. These spatially relative terms are intended to encompass different orientations of the device in use or operation in addition to the orientation depicted in the drawings. The apparatus may be otherwise oriented (e.g., rotated by 90 degrees or at other orientations), and the spatially relative descriptors used herein may likewise be interpreted accordingly.

Notwithstanding that the numerical ranges and parameters setting forth the broad scope of the invention are approximations, the numerical values set forth in the specific examples are reported as precisely as possible. Any numerical value, however, inherently contains certain errors necessarily resulting from the standard deviation found in the respective testing measurements. Also, as used herein, the term "about" generally means within 10%, 5%, 1%, or 0.5% of a given value or range. Alternatively, the term "about" means within an acceptable standard error of the mean when considered by one of ordinary skill in the art. As could be appreciated, other than in the operating/working, examples, or unless otherwise expressly specified, all of the numerical ranges, amounts, values, and percentages (such as those for quantities of materials, durations of times, temperatures, operating conditions, portions of amounts, and the likes) disclosed herein should be understood as modified in all instances by the term "about." Accordingly, unless indicated to the contrary, the numerical parameters set forth in the present disclosure and attached claims are approximations that can vary as desired. At the very least, each numerical parameter should at least be construed in light of the number of reported significant digits and by applying ordinary rounding techniques. Here, ranges can be expressed herein as from one endpoint to another endpoint or between two endpoints. All ranges disclosed herein are inclusive of the endpoints, unless specified otherwise.

There are three main implementations of existing 3D image sensors: stereo binocular, structured light, and time of flight (TOF). Generally, in the TOF implementation, light pulses are transmitted first, and then a TOF sensor is used to sample the reflected light pulses to calculate the time-of-flight of photons between the target and the TOF sensor to obtain the depth information of the target.

However, the time-of-flight obtained by the TOF sensor is often affected by the physical characteristics of the electronic components in the TOF sensor. For example, when the temperature, voltage, or manufacturing process of the operating environment of the TOF sensor changes, the physical characteristics of the electronic components of the TOE' sensor may be changed, causing the phase relationship between the transmission time point of the light pulse and the sampling time of the reflected light pulse to be unable to be fixed a preset value, which reduces the accuracy of the depth information obtained. On the contrary, if the phase relationship between the transmission time point of the light pulse and the sampling time point of the reflected light pulse is not affected by temperature, voltage, or manufacturing process, the accuracy of the TOF sensor can be improved. The details are described below.

Figure 1:
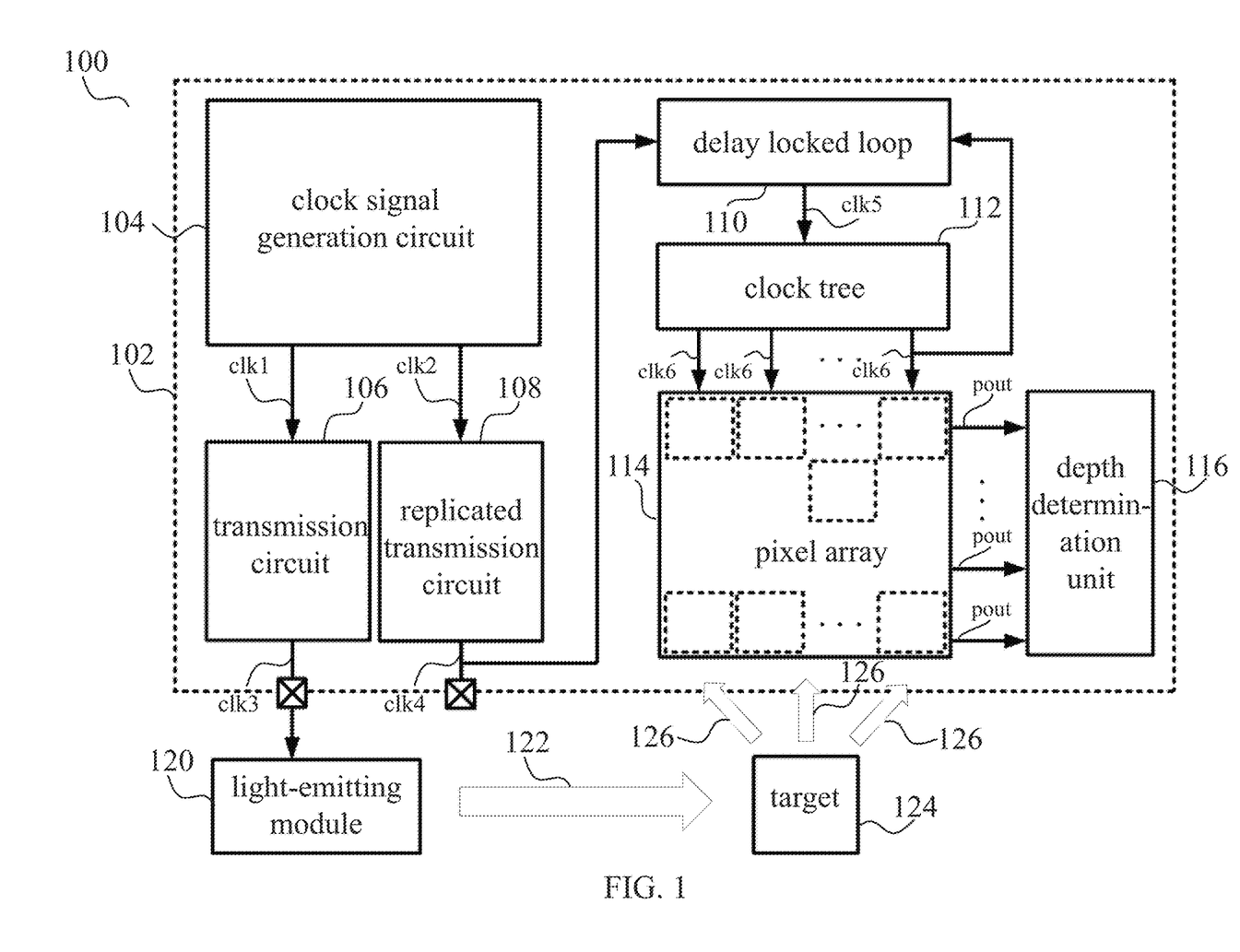
FIG. 1 is a schematic diagram illustrating a TOF distance measuring system according to a first embodiment of the present application.

FIG. 1 is a schematic diagram illustrating a TOF distance measuring system 100 according to the first embodiment of the present application. The TOF distance measuring system 100 includes a TOF sensor 102 and a light-emitting module 120, which is configured to detect the distance between a target 124 and the distance measuring system 100. It should be noted that the distance between the target 124 and the distance measuring system 100 should be smaller than or is equal to the maximum detectable distance of the distance measuring system 100. In the present embodiment, the TOF sensor 102 is disposed at a first chip, for example, the first chip can be a sensor chip, or the TOF sensor 102 is part of the first chip; the light-emitting module 120 is disposed at a second chip, and the first chip and the second chip can be arranged in an electronic device. For example, the electronic device can be, such as, a smartphone, personal digital assistant, a hand-held computing system, or tablet computer, and the like.

Specifically, the TOF sensor 102 controls the light-emitting module 120 to transmit light pulse 122 following the preset frequency, intensity, and the like. In the present embodiment, the TOF sensor 102 controls the light-emitting module 120 to intermittently transmit the light pulse 122. The light pulse 122 is reflected by the target 124 to generate a reflected light pulse 126. The TOF sensor 102 senses and samples the reflected light pulse 126 to generate a sampling result pout, wherein the sampling result pout can be used to calculate the distance between the target 124 and the distance measuring system 100, and a depth information of the target 124 can be obtained by calculating the distances to different parts of the target 124.

The TOF sensor 102 includes a clock signal generation circuit 104, a transmission circuit 106, a replicated transmission circuit 108, a delay locked loop 110, a clock tree 112, and a pixel array 114. In the present embodiment, the clock signal generation circuit 104 is configured to generate a first clock signal clk1 and a second clock signal clk2, wherein the first clock signal clk1 and the second clock signal clk2 have the same frequency, and there is a predetermined phase difference $\varphi 1$ between the first clock signal clk1 and the second clock signal clk2. For example, the clock signal generation circuit 104 can generate the first clock signal clk1 and the second clock signal clk2 based on a reference clock (not shown in the drawings), wherein the reference clock source may come from a crystal oscillator external to the chip on which the TOF sensor is located. Moreover, it should be noted that the value of the predetermined phase difference $\varphi 1$ may be set based on the TOF algorithm, and its determination method is outside the scope of the discussion of this application. Therefore, the present application does not particularly limit the value of the predetermined phase difference φ1; that is, the predetermined phase difference φ1 may be greater than zero, less than zero, or equal to zero.

As can be seen from FIG. 1, the first clock signal clk1 passes through a path to control the light-emitting module 120 to transmit the light pulses 122; the second clock signal clk2 passes through another path to control the timing of the pixel array 114 to sample the reflected light pulse 126. The purpose of this application is to keep the difference between the time point at which the light-emitting module 120 transmits the light pulses 122 and the time point at which the pixel array 114 samples the reflected light pulses 126 at a predetermined phase difference φ1 as much as possible, and independent of temperature, voltage, or manufacturing process.

The transmission circuit 106 is configured to generate a third clock signal clk3 based on the first clock signal clk1, wherein the third clock signal clk3 is outputted to the light-emitting module 120, so that the light-emitting module 120 intermittently transmits the light pulse 122. Generally, the second chip where the light-emitting module 120 is located and the second chip where the TOF sensor 102 is located are different chips, and the frequency the first clock signal clk1 may be several hundred MHz. Therefore, the transmission circuit 106 must process the first clock signal clk1 in order to transmit the first clock signal clk1 out of the chip where the TOF sensor 102 is located. For example, the transmission circuit 106 is a low-voltage differential signaling (LVDS) circuit, which converts the first clock signal clk1 into a small amplitude differential signal to reduce noise and save power consumption. However, the present application is not limited thereto, and the transmission circuit 106 may also use other methods. For example, the third clock signal clk3 may be a non-differential signal.

In short, no matter what method the transmission circuit 106 uses, it is impossible not to delay the first clock signal clk1; that is, it is difficult to ensure that the phase between the first clock signal clk1 after passing through the transmission circuit 106 and the second clock signal clk2 remains unchanged, and thus, and the time point of controlling the light-emitting module 120 to transmit the light pulse 122 becomes uncontrollable. The solution of the present application is to add a replicated transmission circuit 108 in the path from the second dock signal clk2 to the pixel array 114 to simulate the transmission circuit 106. The replicated transmission circuit 108 generates a fourth clock signal clk4 based on the second dock signal clk2. The design of the replicated transmission circuit 108 and the transmission circuit 106 are substantially the same, so the delays cased to the first clock signal clk1 and the third clock signal clk3 are also substantially the same. In addition, since the replicated transmission circuit 108 and the transmission circuit 106 are located on the same chip, the temperature, voltage, or manufacturing process will have substantially the same effects on the replicated transmission circuit 108 and the transmission circuit 106. In other words, changes in temperature, voltage, or manufacturing process will affect both the replicated transmission circuit 108 and the transmission circuit 106, so that the phase difference between the fourth clock signal clk4 and the third clock signal clk3 can be maintained at a predetermined phase difference φ1 when the temperature, bias voltage, or process changes. In some embodiments, the layout of the transmission circuit 106 is directly adjacent to the layout of the replicated transmission circuit 108, so that the effects of temperature, voltage, or manufacturing process on the transmission circuit 106 and the replicated transmission circuit 108 are more uniform.

In the present embodiment, the layout of the replicated transmission circuit 108 and the layout of the transmission circuit 106 are identical. However, the present application is not limited thereto, in certain embodiments, the layout of the replicated transmission circuit 108 and the layout of the transmission circuit 106 are not identical; for example, it is within the scope of this application to dispose the layout of the replicated transmission circuit 108 and the layout of the transmission circuit 106 symmetrically, or through other special designs, as long as the delay caused by the transmission circuit 106 to the first clock signal clk1 and the delay caused by the replicated transmission circuit 108 to the third clock signal can be substantially the same.

Since the fourth clock signal clk4 needs to be distributed to a plurality of pixel columns in the pixel array 114, and generally the number of pixel columns in the pixel array 114 is large, in order to provide sufficient driving ability, the clock tree 12 is needed to generate a plurality of sixth clock signals clk6 with sufficient driving ability to the plurality of pixel columns in the pixel array 114, and to keep the phase relationship between the plurality of sixth clock signals clk6 remains fixed. The delay locked loop 110 is designed to ensure that the phase differences between the plurality of sixth clock signals clk6 outputted by the clock tree 12 and the fourth clock signal clk4 are maintained at zero when temperature, bias voltage, or process changes, so as to ensure that the phase differences between the plurality of sixth clock signals clk6 outputted by the clock tree 12 and the third clock signal clk3 are maintained at the predetermined phase difference φ1. Specifically, the phases of the plurality of sixth clock signals clk6 outputted by the clock tree 12 are the same, and the delay locked loop 110 generates the fifth clock signal clk5 based on one of the plurality of sixth clock signals clk6 and the fourth clock signal clk4.

The clock tree 112 includes a plurality of paths, each of which includes a start terminal and an end terminal, wherein the plurality of start terminals are co-located and configured to receive the fifth clock signal clk5, and the plurality of end terminal respectively are coupled to a plurality of pixel columns of the pixel array 114, so that the fifth clock signal clk5 starts from the source, and after passing through the plurality of paths, becomes the plurality of sixth clock signals clk6 to the plurality of pixel columns, and the plurality of paths respectively have a plurality of buffers to increase the driving ability, and the signal transmission distance and arrangement of buffers of each of the plurality of paths from the start terminal to the end terminal are designed such that, for example, the plurality of paths have the same length and have the same number of buffers so that the phase difference between the plurality of sixth clock signals clk6 can be maintained at zero when temperature, bias voltage or process changes.

It should be noted that the delay of each transmission line between the clock signal generation circuit 104, the transmission circuit 106, the replicated transmission circuit 108, the delay locked loop 110, the clock tree 112, and the pixel array 114 in FIG. 1 is relatively small compared to the compensation brought by the replicated transmission circuit 108 and the delay locked loop 110 and the clock tree 112, so the delay of each transmission line alone is ignored and not discussed here.

Figure 2:
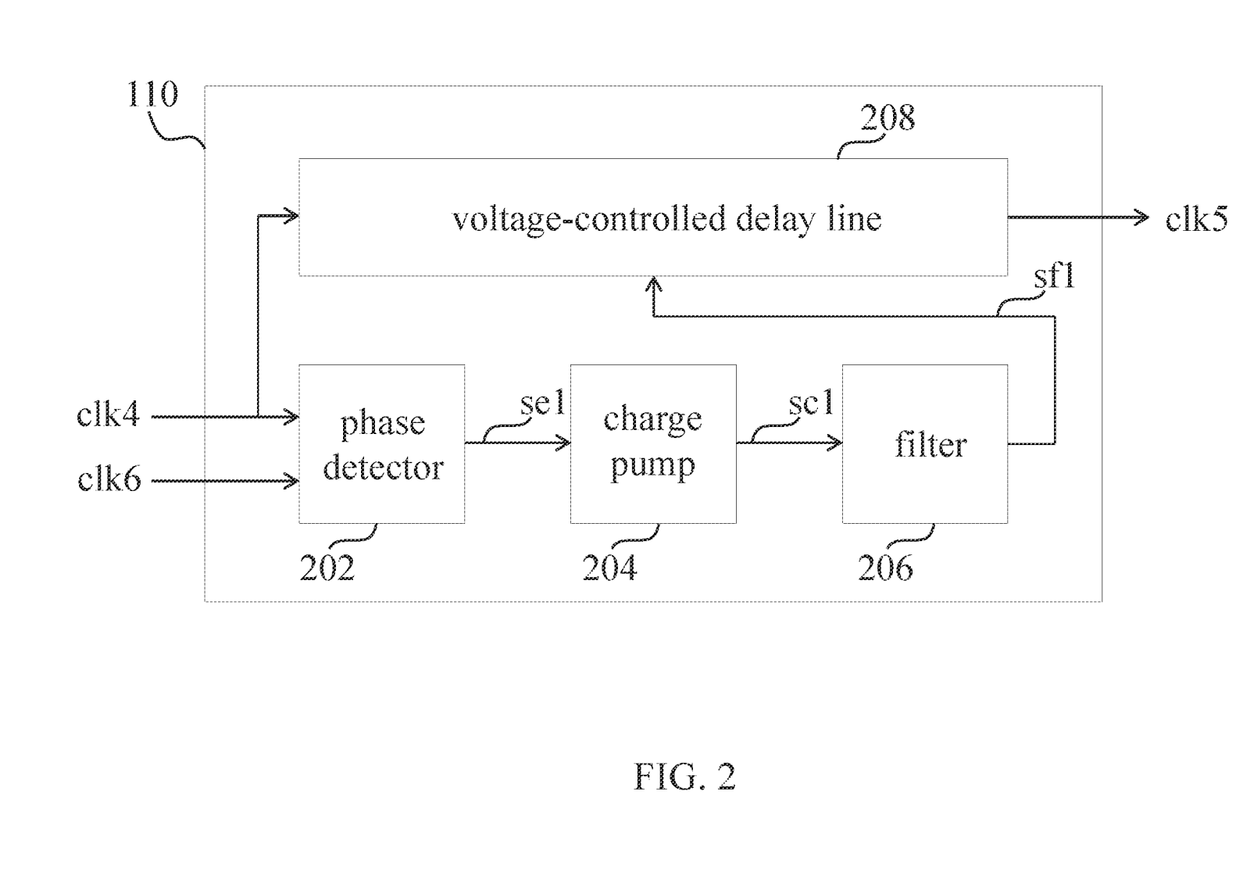
FIG. 2 is a schematic diagram illustrating a delay locked loop shown in FIG. 1 according to a first embodiment of the present application.

FIG. 2 is a schematic diagram illustrating the delay locked loop 110 shown in FIG. 1 according to the first embodiment of the present application. The delay locked loop 110 includes a phase detector 202, a charge pump 204, a filter 206, and a voltage-controlled delay line 208. The phase detector 202 receives any one of the sixth clock signals clk6 and the fourth clock signal clk4 and is configured to generate phase difference information se1 between the sixth clock signal and the fourth clock signal clk4. In the embodiment of FIG. 2, the phase detector 202 is implemented using an analog circuit. The charge pump 204 is configured to generate a voltage information sc1 in response to the phase difference information se1 to charge or discharge the filter 206; the filter 206 performs a filtering process on the voltage information sc1 to generate a voltage-controlled delay line control signal sf1. In the embodiment of FIG. 2, the filter 206 is implemented using an analog circuit.

The voltage-controlled delay line 208 is configured to control the fourth clock signal clk4 to pass through the voltage-controlled delay line 208 to generate the fifth clock signal clk5, and voltage-controlled delay line 208 causes a variable phase difference variable phase difference between the fifth clock signal clk5 and the fourth clock signal clk4, wherein the variable phase difference is under the control of the voltage-controlled delay line control signal sf1. In the embodiment of FIG. 2, the voltage-controlled delay line 208 is implemented using an analog circuit. That is, the voltage-controlled delay line is under the control of the control signal sf1, so that the fourth clock signal clk4 input to the voltage-controlled delay line generates a corresponding phase difference to output the fifth clock signal clk5.

Figure 3:
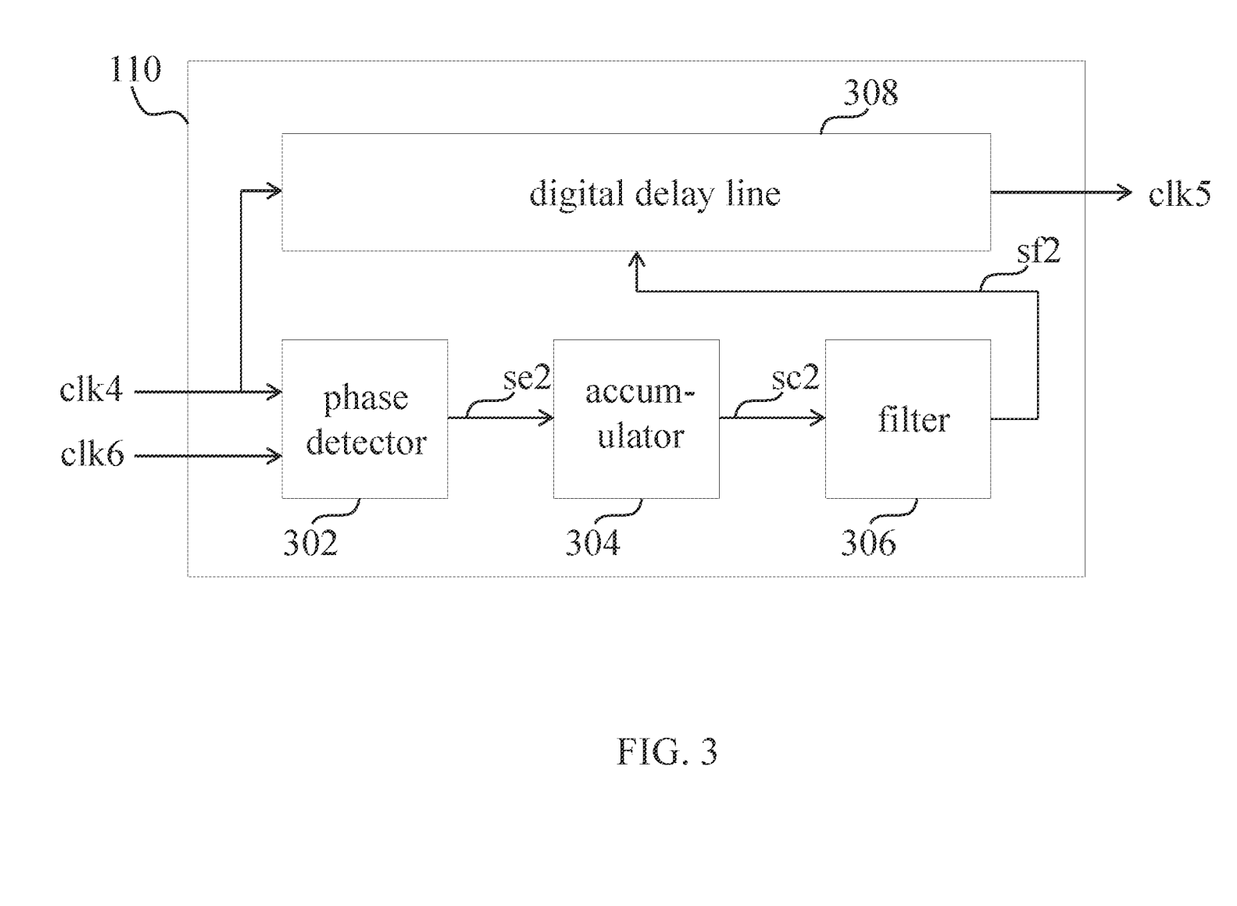
FIG. 3 is a schematic diagram illustrating a delay locked loop shown in FIG. 1 according to a second embodiment of the present application.

FIG. 3 is a schematic diagram illustrating the delay locked loop 110 shown in FIG. 1 according to the second embodiment of the present application. The delay locked loop 110 includes a phase detector 302, an accumulator 304, a filter 306, and a digital delay line 308. The delay locked loop 110 in FIG. 3 is similar to the delay locked loop 110 in FIG. 2, and the difference is that the delay locked loop 110 in FIG. 3 is implemented by a digital circuit. The phase detector 302 is configured to generate phase difference information set between one of the plurality of sixth clock signals clk6 and the fourth clock signal clk4. In the embodiment in FIG. 3, the phase detector 302 is implemented using an analog circuit. The accumulator 304 is configured to generate an accumulated phase information sc2 to the filter 306 based on the accumulated phase difference information se2, so that the filter 306 performs a filtering process on the voltage information sc2 to generate a digital delay line control signal sf2. In the embodiment in FIG. 3, the filter 306 is implemented using a digital circuit.

The digital delay line 308 is configured to control the fourth clock signal clk4 to pass through the digital delay line 308 to generate the fifth clock signal clk5, and digital delay line 208 causes a variable phase difference between the fifth clock signal clk5 and the fourth clock signal clk4, wherein the variable phase difference is under the control of the digital delay line control signal sf2.

The pixel array 114 has a plurality of pixel columns, wherein the plurality of pixel columns respectively sample the reflected light pulse 126 based on the plurality of sixth clock signals clk6 to generate a sampling result pout. In certain embodiments, the TOF sensor 102 can includes a depth determination unit 116, wherein the depth determination unit 116 is configured to obtain a depth information of the target 124 based on the sampling result pout. In some other embodiments, the depth determination unit 116 can be optional; for example, the sampling result pout generated by the pixel array 114 may be transmitted to a processor external to the chip where the TOF sensor 102 is located to calculate the depth information of the target 124.

Figure 4:
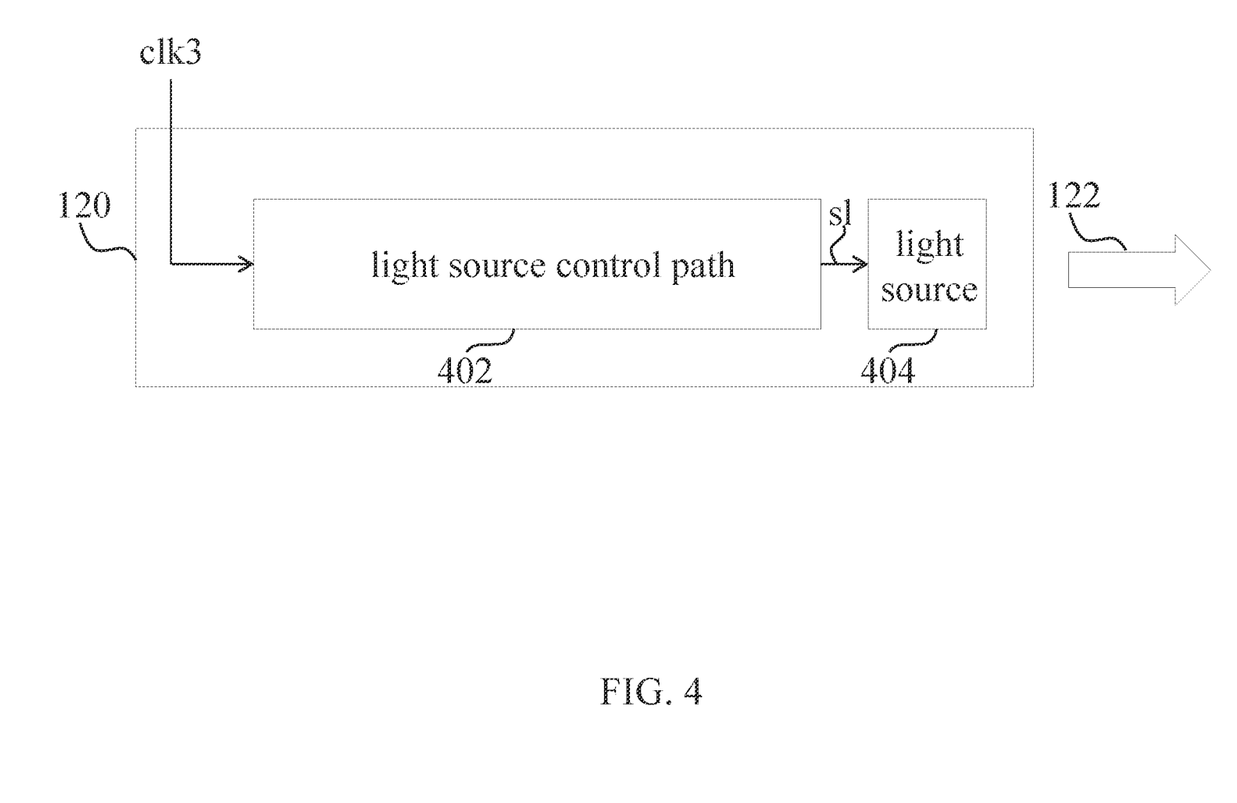
FIG. 4 is a schematic diagram illustrating a light-emitting module shown in FIG. 1 according to one embodiment of the present application.

In some embodiments, in order to ensure that the interval between the time when the third clock signal clk3 reaches the light-emitting module 120 and the time when the light pulse 122 is actually transmitted is changed due to changes in temperature, bias voltage, or process, the light-emitting module 120 in FIG. 4 can be used. FIG. 4 is a schematic diagram of an embodiment of the light-emitting module 120 in FIG. 1. In FIG. 4, after the third clock signal clk3 reaches the light-emitting module 120, the light source control signal s1 is generated through the light source control path 402, and the light source 404 intermittently transmits light pulses 122 according to the light source control signal s1. The light source 404 may be (but is not limited to) a laser diode (LD), a light-emitting diode (LED), or other light sources that can generate light pulses 122. The light source control path 402 is specifically designed so that the phase difference between the light source control signal s1 and the third clock signal clk3 is not affected by temperature, bias voltage, or process.

However, the embodiment of FIG. 1 does not necessarily require the use of the light-emitting module 120 of FIG. 4. However, the use of a general light-emitting module may contribute a slight error such that the difference between the time point at which the light-emitting module 120 transmits the light pulse 122 and the time point at which the pixel array 114 samples the reflected light pulse 126 is not exactly equal to the predetermined phase difference $\varphi 1$. Therefore, the present application also presents the embodiment of FIG. 5 to provide an alternative to using the light-emitting module 120 of FIG. 4.

Figure 5:
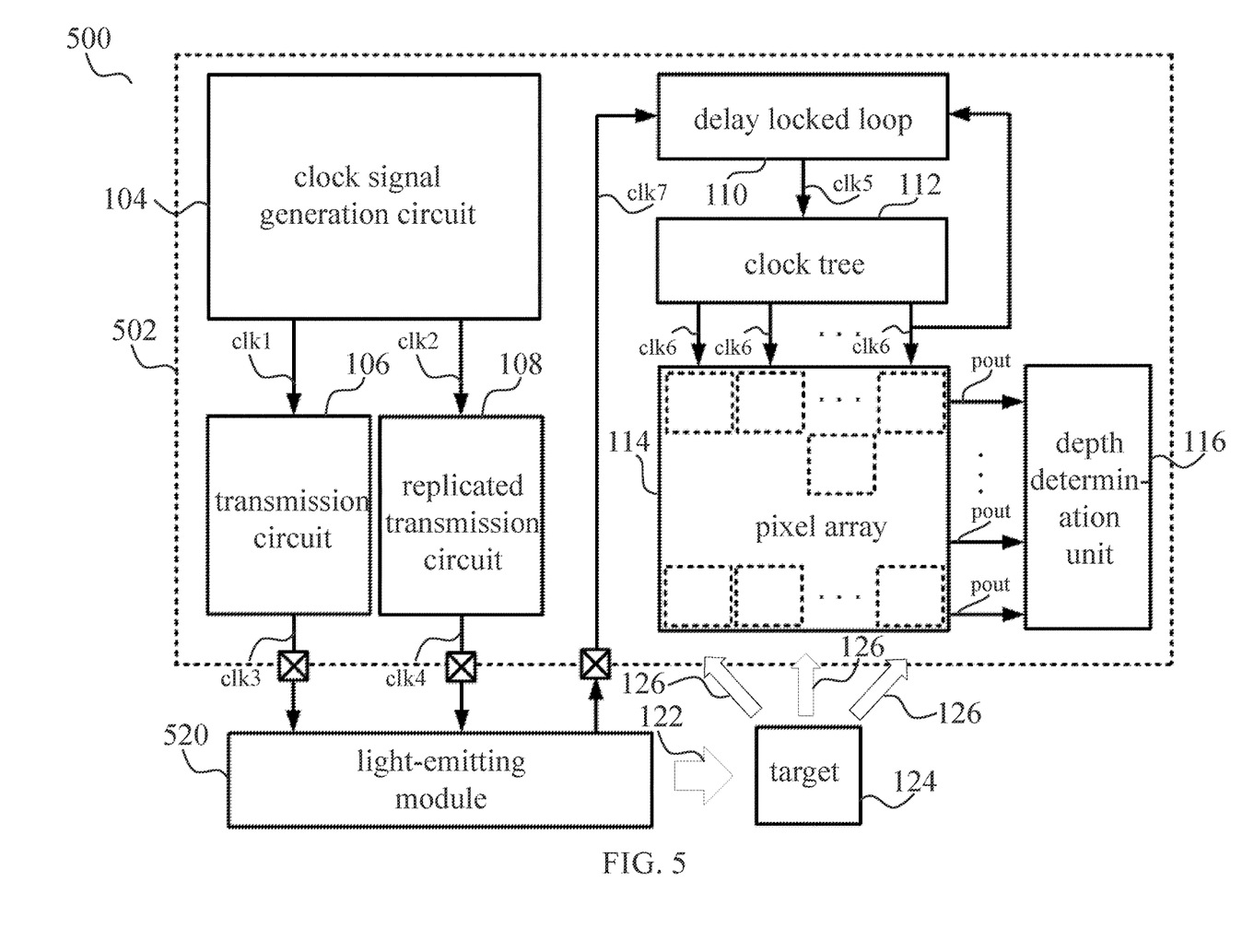
FIG. 5 is a schematic diagram illustrating a TOF distance measuring system according to a second embodiment of the present application.

FIG. 5 is a schematic diagram of a second embodiment of the TOF distance measuring system 500 of the present application. The difference between the TOF distance measuring system 500 in FIG. 5 and the TOF distance measuring system 100 in FIG. 1 is that the fourth clock signal clk4 in FIG. 1 is sent directly to the delay locked loop 110, but the fourth clock signal clk4 in FIG. 5 is sent to the light-emitting module 520 outside the chip where the TOF sensor 502 is located before it is fed back to the delay locked loop 110. The purpose is to additionally simulate the light source control path 602 of the light emitting module 520 in the path of the second clock signal clk2 to match the path of the first clock signal clk1.

Figure 6:
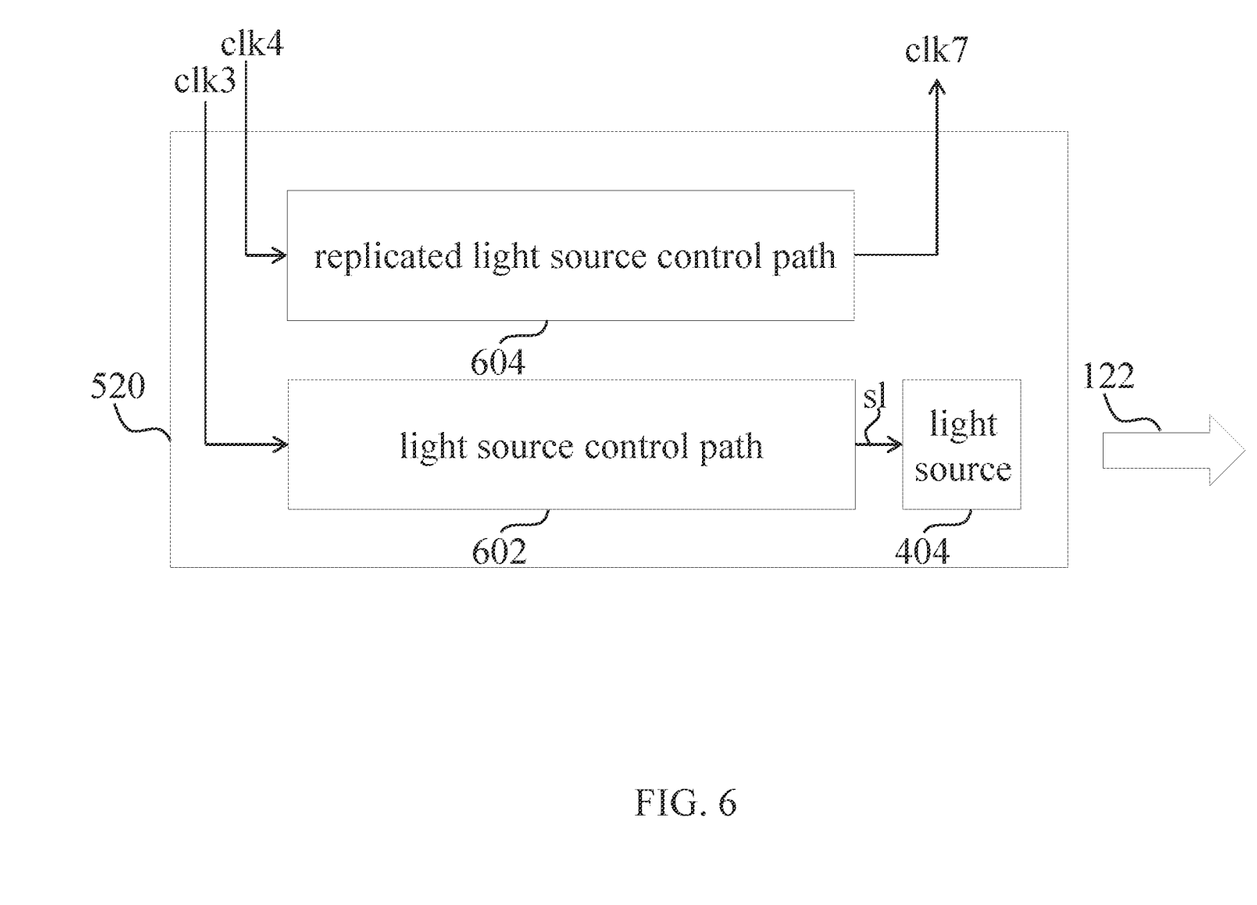
FIG. 6 is a schematic diagram illustrating a light-emitting module shown in FIG. 5 according to one embodiment of the present application.

FIG. 6 shows a schematic diagram of an embodiment of light emitting module 520 in FIG. 5. In the present embodiment, a replicated light source control path 604 is additionally incorporated in the path between the second clock signal clk2 to the pixel array 114 of the light-emitting module 520 to simulate a light source control path 602, wherein the replicated light source control path 604 generate a seventh clock signal clk7 based on the fourth clock signal clk4, Because the replicated light source control path 604 and light source control path 602 are designed in substantially the same way, the delays caused to the third clock signal clk3 and the fourth clock signal clk4 are also substantially the same. In addition, since the replicated light source control path and light source control path 602 are located in the same chip, the effect of temperature, voltage, or manufacturing process on the replicated light source control path 604 and the light source control path 602 is substantially the same. In other words, a change in temperature, voltage, or manufacturing process will cause the replicated light source control path and the light source control path 602 to change synchronously, causing the phase difference between the light source control signal s1 and the seventh clock signal clk7 can be maintained at a predetermined phase difference $\varphi 1$ when temperature, bias voltage, or process changes. The seventh clock signal clk7 is also fed back to the delay locked loop 110 of the delay locked loop 110.

In the present embodiment, the layout of the replicated light source control path 604 and the layout of the light source control path 602 are identical. However, the present application is not limited thereto; in some embodiments, the layout of the replicated light source control path 604 and the layout of the light source control path 602 are not identical, for example; for example, it is within the scope of this application to dispose the layout of the replicated light source control path 604 and the layout of the light source control path 602 symmetrically, or through other special designs, as long as the delay caused by the light source control path 602 to the third clock signal clk3 and the delay caused by the light source control path 602 to the fourth clock signal clk4 can be substantially the same.

The foregoing outlines features of several embodiments of the present application so that persons having ordinary skill in the art may better understand the various aspects of the present disclosure. Persons having ordinary skill in the art should appreciate that they may readily use the present disclosure as a basis for designing or modifying other processes and structures for carrying out the same purposes and/or achieving the same advantages of the embodiments introduced herein. Persons having ordinary skill in the art should also realize that such equivalent constructions do not depart from the spirit and scope of the present disclosure, and that they may make various changes, substitutions, and alternations herein without departing from the spirit and scope of the present disclosure.

What is claimed is:

1. A time-of-flight (TOF) sensor, wherein the TOF sensor controls a light-emitting module to intermittently transmit a light pulse, and the light pulse is reflected by a target to generate a reflected light pulse, wherein the TOF sensor comprises:
    a clock signal generation circuit, configured to generate a first clock signal and a second clock signal, wherein the first clock signal and the second clock signal have a same frequency, and there is a predetermined phase difference between the first clock signal and the second clock signal;
    a transmission circuit, configured to generate a third clock signal based on the first clock signal, wherein the third clock signal is outputted to the light-emitting module, so that the light-emitting module intermittently transmit the light pulse;
    a replicated transmission circuit, configured to simulate the transmission circuit, and generate a fourth clock signal based on the second clock signal, so that the phase difference between the fourth clock signal and the third clock signal is kept the same as the predetermined phase difference;
    a delay locked loop, coupled to the replicated transmission circuit and one of a plurality of sixth clock signals to generate a fifth clock signal; so that the phase difference between one of the plurality of sixth clock signals and the fourth clock signal is kept at zero;
    a clock tree, configured to generate the plurality of sixth clock signals based on the fifth clock signal, wherein a plurality of phases of the plurality of sixth clock signals are all the same; and
    a pixel array, having a plurality of pixel columns, wherein the plurality of pixel columns perform sampling on the reflected light pulse; respectively, based on the plurality of sixth clock signals to generate a sampling result.

2. The TOF sensor of claim 1, wherein the clock tree comprises a plurality of paths, wherein the plurality of paths respectively include a start terminal and an end terminal, the plurality of start terminals are co-located and configured to receive the fifth clock signal, the plurality of end terminal are respectively coupled to the plurality of pixel columns, so that the fifth clock signal, starting from the source, becomes a plurality of sixth clock signals to the plurality of pixel columns via the plurality of paths, and a signal transmission distance of each of the plurality of paths matched to each other from the start terminal to the end terminal, so that phase differences between the plurality of sixth clock signals are kept at zero when temperature, bias voltage, or process changes.

3. The TOF sensor of claim 1, wherein the TOF sensor is disposed at a first chip, and a layout of the transmission circuit is adjacent to a layout of the replicated transmission circuit.

4. The TOF sensor of claim 1, wherein the delay locked loop generates the fifth clock signal based the fourth clock signal and on one of the plurality of sixth clock signals.

5. The TOF sensor of claim 4, wherein the delay locked loop comprises:
    a phase detector, configured to generate phase difference information between one of the plurality of sixth clock signals and the fourth clock signal;
    a charge pump, configured to generate a voltage information to a filter based on the phase difference information;
    the filter, configured to perform a filtering process on the voltage information to generate a voltage-controlled delay line control signal; and
    a voltage-controlled delay line, configured to control the fourth clock signal to pass through the voltage-controlled delay line to generate the fifth clock signal, and the voltage-controlled delay line results in a variable phase difference between the fifth clock signal and the fourth clock signal, and the variable phase difference is under the control of the voltage-controlled delay line control signal.

6. The TOF sensor of claim 4, wherein the delay locked loop comprises:
    a phase detector, configured to generate phase difference information between one of the plurality of sixth clock signals and the fourth clock signal;
    an accumulator, configured to accumulate the phase difference information to generate accumulated phase information to a filter;
    the filter, configured to perform a filtering process on the accumulated phase information to generate a digital delay line control signal; and
    a digital delay line, configured to control the fourth clock signal to pass through the digital delay line to generate the fifth clock signal, and the digital delay line results in a variable phase difference between the fifth clock signal and the fourth clock signal, and the variable phase difference is under the control of the digital delay line control signal.

7. The TOF sensor of claim 1, wherein the TOE sensor further comprises:
    a depth determination unit, configured to obtain a depth information based on the sampling result.

8. A time-of-flight (TOF) distance measuring system, wherein the TOF distance measuring system comprises a TOE sensor and a light-emitting module, wherein the light-emitting module is controlled by the TOF sensor to intermittently transmit a light pulse, and the light pulse is reflected by a target to generate a reflected light pulse, the TOF sensor comprises:
    a clock signal generation circuit, configured to generate a first clock signal and a second clock signal, wherein the first clock signal and the second clock signal have a same frequency, and there is a predetermined phase difference between the first clock signal and the second clock signal;

a transmission circuit, configured to generate a third clock signal based on the first clock signal, wherein the third clock signal is outputted to the light-emitting module, so that the light-emitting module intermittently transmit the light pulse;

a replicated transmission circuit, configured to simulate the transmission circuit, and generate a fourth clock signal based on the second clock signal, so that the phase difference between the fourth clock signal and the third clock signal is kept the same as the predetermined phase difference;

a delay locked loop, coupled to the replicated transmission circuit and one of a plurality of sixth clock signals to generate a fifth clock signal, so that the phase difference between one of the plurality of sixth clock signals and the fourth clock signal is kept at zero;

a clock tree, configured to generate the plurality of sixth clock signals based on the fifth clock signal, wherein a plurality of phases of the plurality of sixth clock signals are all the same; and a pixel array, having a plurality of pixel columns, wherein the plurality of pixel columns perform sampling on the reflected light pulse, respectively, based on the plurality of sixth clock signals to generate a sampling result.

9. The TOF distance measuring system of claim 8, wherein the light emitting module comprises:
a light source control path, configured to generate a light source control signal based on the third clock signal; and
a light source, configured to intermittently transmit the light pulse based on the light source control signal.

10. The distance measuring system of claim 9, wherein a phase difference between the third clock signal and the light source control signal is zero.

11. The TOF distance measuring system of claim 8, wherein
the light-emitting module comprises:
a light source control path, configured to generate a light source control signal based on the third clock signal;
a replicated light source control path, coupled between the replicated transmission circuit and the delay locked loop, wherein the replicated light source control path is configured to simulate the light source control path, and generate a seventh clock signal to the delay locked loop of the TOF sensor based on the fourth clock signal, so that the phase difference between the light source control signal and the seventh clock signal is kept the same as a predetermined phase difference when temperature, bias voltage, or process changes; and
a light source, configured to intermittently transmit the light se based on the light source control signal.

12. The TOF distance measuring system of claim 11, wherein the light-emitting module is disposed at a second chip, and a layout of the light source control path is adjacent to a layout of the replicated light source control path.

13. The TOF distance measuring system of claim 11, wherein the delay locked loop comprises:
a phase detector, configured to generate phase difference information between one of the plurality of sixth clock signals and the seventh clock signal;
a charge pump, configured to generate a voltage information to a filter based on the phase difference information;
the filter, configured to perform a filtering process on the voltage information to generate a voltage-controlled delay line control signal; and
a voltage-controlled delay line, configured to control the seventh clock signal to pass through the voltage-controlled delay line to generate the fifth clock signal, and the voltage-controlled delay line results in a variable phase difference between the fifth clock signal and the seventh clock signal, and the variable phase difference is under the control of the voltage-controlled delay line control signal.

14. The TOF distance measuring system of claim 11, wherein the delay locked loop comprises:
a phase detector, configured to generate phase difference information between one of the plurality of sixth clock signals and the seventh clock signal;
an accumulator, configured to accumulate the phase difference information to generate accumulated phase information to a filter;
the filter, configured to perform a filtering process on the accumulated phase information to generate a digital delay line control signal; and
a digital delay line, configured to control the fourth clock signal to pass through the digital delay line to generate the fifth clock signal, and the digital delay line results in a variable phase difference between the fifth clock signal and the seventh clock signal, and the variable phase difference is under the control of the digital delay line control signal.

15. The TOF distance measuring system of claim 8, wherein the clock tree comprises a plurality of paths, wherein the plurality of paths respectively include a start terminal and an end terminal, the plurality of start terminals are co-located and configured to receive the fifth clock signal, the plurality of end terminal are respectively coupled to the plurality of pixel columns, so that the fifth clock signal, starting from the source, becomes a plurality of sixth clock signals to the plurality of pixel columns via the plurality of paths, and a signal transmission distance of each of the plurality of paths matched to each other from the start terminal to the end terminal, so that phase differences between the plurality of sixth clock signals are kept at zero when temperature, bias voltage, or process changes.

16. The TOF distance measuring system of claim 8, wherein the TOF sensor is disposed at a first chip, and a layout of the transmission circuit is adjacent to a layout of the replicated transmission circuit.

17. The TOF distance measuring system of claim 8, wherein the delay locked loop generates the fifth clock signal based the fourth clock signal and on one of the plurality of sixth clock signals.

18. The TOF distance measuring system of claim 17, wherein the delay locked loop comprises:
a phase detector, configured to generate phase difference information between one of the plurality of sixth clock signals and the fourth clock signal;
a charge pump, configured to generate a voltage information to a fitter based on the phase difference information;
the filter, configured to perform a filtering process on the voltage information to generate a voltage-controlled delay line control signal; and
a voltage-controlled delay line, configured to control the fourth clock signal to pass through the voltage-controlled delay line to generate the fifth clock signal, and the voltage-controlled delay line results in a variable phase difference between the fifth clock signal and the fourth clock signal, and the variable phase difference is under the control of the voltage-controlled delay line control signal.

19. The TOF distance measuring system of claim 17, wherein t delay locked loop comprises:
   a phase detector, configured to generate phase difference information between one of the plurality of sixth clock signals and the fourth clock signal;
   an accumulator, configured to accumulate the phase difference information to generate accumulated phase information to a filter;
   the filter, configured to perform a filtering process on the accumulated phase information to generate a digital delay line control signal; and
   a digital delay line, configured to control the fourth clock signal to pass through the digital delay line to generate the fifth clock signal, and the digital delay line results in a variable phase difference between the fifth clock signal and the fourth clock signal, and the variable phase difference is under the control of the digital delay line control signal.

20. An electronic device, comprising:
   a TOF distance measuring system according to claim 8; and
   a processor, coupled to the TOF distance measuring system.

* * * * *